(12) United States Patent
Watanabe et al.

(10) Patent No.: US 6,621,699 B2
(45) Date of Patent: Sep. 16, 2003

(54) ELECTRONIC COMPONENT COOLING APPARATUS

(75) Inventors: Michinori Watanabe, Tokyo (JP);
Toshiki Ogawara, Tokyo (JP);
Haruhisa Maruyama, Tokyo (JP)

(73) Assignee: Sanyo Denki Co., Ltd., Tokyo (JP)

( * ) Notice: Subject to any disclaimer, the term of this patent is extended or adjusted under 35 U.S.C. 154(b) by 0 days.

(21) Appl. No.: 10/185,202

(22) Filed: Jun. 28, 2002

(65) Prior Publication Data

US 2003/0002257 A1 Jan. 2, 2003

(30) Foreign Application Priority Data

Jun. 29, 2001 (JP) ........................................ 2001-199937

(51) Int. Cl.⁷ ................................................. H05K 7/20
(52) U.S. Cl. .................... 361/697; 165/80.3; 165/121; 361/695; 257/718; 257/722; 415/177
(58) Field of Search ............................... 165/80.2, 80.3, 165/185, 121–126; 257/707, 712–713, 722, 718–719, 726–727; 361/690, 694–697, 710, 715, 719–720; 415/175–177

(56) References Cited

U.S. PATENT DOCUMENTS 5,615,998 A * 4/1997 Kodama et al. ............. 415/177
5,677,829 A * 10/1997 Clemens ..................... 361/697
6,137,680 A * 10/2000 Kodaira et al. ............. 361/697
6,301,110 B1 * 10/2001 Kodaira ...................... 361/697
6,311,766 B1 * 11/2001 Lin et al. ................... 165/80.3
6,480,383 B2 * 11/2002 Kodaira et al. ............. 361/697

FOREIGN PATENT DOCUMENTS

JP            11-279876           4/2001

* cited by examiner

*Primary Examiner*—Gregory Thompson
(74) *Attorney, Agent, or Firm*—Rankin, Hill, Porter & Clark LLP

(57) ABSTRACT

An electronic component cooling apparatus is provided that can prevent a reduction in a heat dissipation effect on an electronic component with a pushing force toward a heat sink thereof being applied to the opposite wall of a casing thereof. Pushing force transferring sections 37 for transferring a pushing force from mounting tools 35 to a heat sink 3 through contact with leading ends of radiation fins 11 are integrally formed on a pair of wall sections 25a of a casing 21. The pushing force transfer sections 37 have a shape that can distribute the pushing force and transfer distributed force to the heat sink 3 so as to prevent a force applied to an electronic component MPU by the pushing force from being locally and extremely increased.

12 Claims, 6 Drawing Sheets

ELECTRONIC COMPONENT COOLING APPARATUS

BACKGROUND OF THE INVENTION

The present invention relates to an electric component cooling apparatus for cooling an electronic component such as an MPU or the like, and more particularly to an electronic component cooling apparatus of the type that a heat sink on which an electronic component is mounted is forcibly cooled by air fed from a fan unit.

As shown in FIG. 6, an electronic component cooling apparatus disclosed in Japanese Patent Application Laid-Open Publication No. 102787/2001 comprises a heat sink 102 having a plurality of radiation fins 101, a fan unit 105 including an impeller 103 driven by a motor and a casing 104, and casing mounting means 106 located at opposite sides of the casing 104. The casing mounting means 106 are provided to mount the casing 104 on the heat sink 102 so that a gap is provided between the leading ends of the radiation fins 101 and an opposite wall 104a of the casing 104. Air discharged from the impeller 103 passes through the gap formed between the leading ends of the radiation fins 101 and the opposite wall 104a and through intervals between the radiation fins 101 in the heat sink 102, and then flows out to the outside of the casing 104 and the heat sink 102. The electronic component 108 mounted on a base 102a is thereby cooled. The electronic component cooling apparatus is mounted on a circuit board 100 using mounting tools of various structures. Recently, a mounting tool such as a mounting tool 107, indicated by a dotted line in FIG. 6, has also been conceived. In this example, a pushing force toward the heat sink 102 is applied to the opposite wall 104a of the casing 104 to push the base 102a of the heat sink 102 against the electronic component 108, thereby mounting the electronic component cooling device on the circuit board 100.

In this conventional electronic component cooling apparatus, however, a pushing force applied by the mounting tool 107 is exerted on the base 102a through the casing mounting means 106 located on the opposite sides of the casing 104. In this case, a force exerted on the electronic component 108, based on the pushing force locally becomes larger or becomes unbalanced. In this case, for example, a large force is locally applied to an upper corner 108a of the electronic component 108. For this reason, unbalanced contact occurs between the electronic component 108 and the base 102a of the heat sink 102, so that heat dissipation from the electronic component 108 becomes locally unbalanced, and the heat dissipation effect of the electronic component might be thereby reduced.

SUMMARY OF THE INVENTION

The present invention has been made in view of the foregoing disadvantage of the prior art.

Accordingly, it is an object of the present invention to provide an electronic component cooling apparatus that can prevent a reduction in the heat dissipation effect of an electronic component when a pushing force toward a heat sink is exerted on the opposite wall of a casing.

It is another object of the present invention to provide an electronic component cooling apparatus that can prevent extreme unbalance in contact between the base of a heat sink and an electronic component when a pushing force toward the heat sink is exerted on the opposite wall of a casing.

It is a further object of the present invention to provide an electronic component cooling apparatus that does not extremely increase air resistance against air that passes through a gap formed between the opposite wall of a casing and a plurality of radiation fins in a heat sink.

In accordance with the present invention, an electronic component cooling apparatus comprises a heat sink, a fan unit, and casing mounting means. The heat sink has a base having a front surface provided thereon with a plurality of radiation fins and a rear surface to be mounted thereon with an electronic component to be cooled. The fan unit includes an impeller having a plurality of blades, a motor for rotating the impeller mounted on a rotor fixedly mounted on a revolving shaft, and a casing having an opposite wall arranged opposite to leading ends of the radiation fins in the heat sink, and an opening for receiving the impeller. The casing mounting means is provided to mount the casing on the heat sink so that the leading ends of the radiation fins are spaced from the opposite wall to define a gap. In this electronic component cooling apparatus, air discharged from the impeller passes through the gap between the heat sink and the leading ends of the radiation fins and through intervals between the radiation fins for discharge to the outside of the casing and the heat sink. Then, when the electronic component cooling apparatus is used, the base of the heat sink is pushed against the electronic component with the pushing force toward the heat sink being applied to a pair of wall sections of the opposite wall located with the opening of the casing interposed therebetween.

In accordance with the present invention, at least one pushing force transferring section for transferring the pushing force to the heat sink through contact with the leading ends of the radiation fins is integrally provided at each of a pair of wall sections of the opposite wall of the casing. Then, at least one pushing force transferring section at each of the pair of wall sections is constructed to distribute the pushing force and transfer distributed force to the heat sink so as to prevent a force applied or transferred to the electronic component by the pushing force from increasing locally and excessively, or being brought into an unbalanced state.

If at least one pushing force transferring section is provided in accordance with the present invention, a pushing force is transferred to the heat sink through the casing mounting means and the pushing force transferring section, with the pushing force toward the hear sink applied to the pair of the wall sections of the opposite wall of the casing. Then, this pushing force is exerted on the electronic component through the heat sink. For this reason, the pushing force is distributed and the distributed force is transferred to the heat sink due to the existence of the pushing force transferring section, so that the force exerted on the electronic component will not increase locally and extremely. In other words, the balanced pushing force is exerted on the entire electronic component, thereby eliminating extreme unbalance in contact between the base of the heat sink and the electronic component. Consequently, an occurrence of local unbalance in heat dissipation of the electronic component can be prevented. A reduction in efficiency of heat dissipation can be thereby prevented.

Preferably, the cross sectional profile or shape of the pushing force transferring section is defined so as to reduce air resistance against the air that passes through the gap between the leading ends of the radiation fins and the opposite wall. This arrangement can streamline the airflow, which would be severely blocked due to the existence of the pushing force transferring section, thereby preventing the cooling effect of the radiation fins from decreasing. In this case, if the cross sectional profile of the pushing force transferring section is formed to have substantially a circular shape, air resistance can be reduced, and the mechanical strength of the pushing force transferring section can be increased.

Further, if an axial fan unit for discharging air in one axial direction of the revolving shaft of the motor is employed as the fan unit, it is preferable that the cross sectional shape of the pushing force transferring section is formed to have an elongate, streamlined shape so that it parallels airflow discharged from the fan unit and then passing through the gap or so that it does not make a large resistance against the airflow. With this arrangement, air resistance of the pushing force transferring section against airflow can be reduced.

Still further, when providing each of pushing force transferring sections for each of the pair of wall sections, it is preferable that the pushing force transferring sections are provided symmetrically on opposite sides of the opening formed in the opposite wall of the casing. With this arrangement, a force exerted on the electronic component becomes symmetrical with respect to the opening, so that the force distributed and then exerted on the electronic component is made to be balanced. Further, since two airflows flowing within the gap in two opposite directions with respect to the opening can be made to be symmetrical, the cooling effects of the radiation fins can be prevented from varying significantly. In order to attain possibly the best balanced contact between the base of the heat sink and the electronic component as well as the force distribution and exertion on the electronic component, the pushing force transferring sections should be respectively formed at the central portions of the pair of the wall sections of the opposite wall.

More particularly, an electronic component cooling apparatus of the present invention comprises a heat sink having a base having a front surface provided thereon with a plurality of radiation fins and a rear surface to be mounted thereon with an electronic component to be cooled, a pair of heat sink side walls being upright from a pair of opposite ends of the base with the radiation fins interposed therebetween, and an axial fan unit. The fan unit includes an impeller having a plurality of blades, a motor for rotating the impeller mounted on a rotor fixedly mounted on a revolving shaft, a casing having an opposite wall arranged opposite to leading ends of the radiation fins in the heat sink with a gap, a pair of casing side walls extending to the heat sink from opposite edges of the opposite wall, and an opening for receiving the impeller and the motor, and a plurality of webs coupling a housing of the motor to the casing so that the motor is positioned at a central portion of the opening. The fan unit further includes casing mounting means for mounting the casing on the heat sink by engagement of engaging sections each provided on the pair of casing side walls with engaged sections each provided on the pair of heat sink side walls. Then, the casing and the heat sink are constructed to form a pair of openings which allow air, discharged from the impeller and passing through the gap and intervals between the radiation fins in the heat sink, to go out of the casing and the heat sink in two opposite directions for discharge. The base in the heat sink is pushed against the electronic component with the pushing force toward the heat sink being applied to a pair of wall sections of the opposite wall located in the two directions with the opening of the casing interposed therebetween. The pushing force transferring sections for transferring the pushing force to the heat sink through contact with the leading ends of the radiation fins are each integrally formed on each of the pair of wall sections of the opposite wall, and the pushing force transferring sections are constructed to distribute the pushing force and transfer distributed force to the heat sink so that a force applied to the electronic component through the casing mounting means, the pushing force transferring sections, and the heat sink based on the pushing force is not so unbalanced as to cause extreme unbalance in contact between the electronic component and the base of the heat sink.

BRIEF DESCRIPTION OF THE DRAWINGS

These and other objects and many of the attendant advantages of the present invention will be readily appreciated as the same becomes better understood by reference to the following detailed description when considered in connection with the accompanying drawings; wherein.

DETAILED DESCRIPTION OF THE PREFERRED EMBODIMENTS

Figure 1:
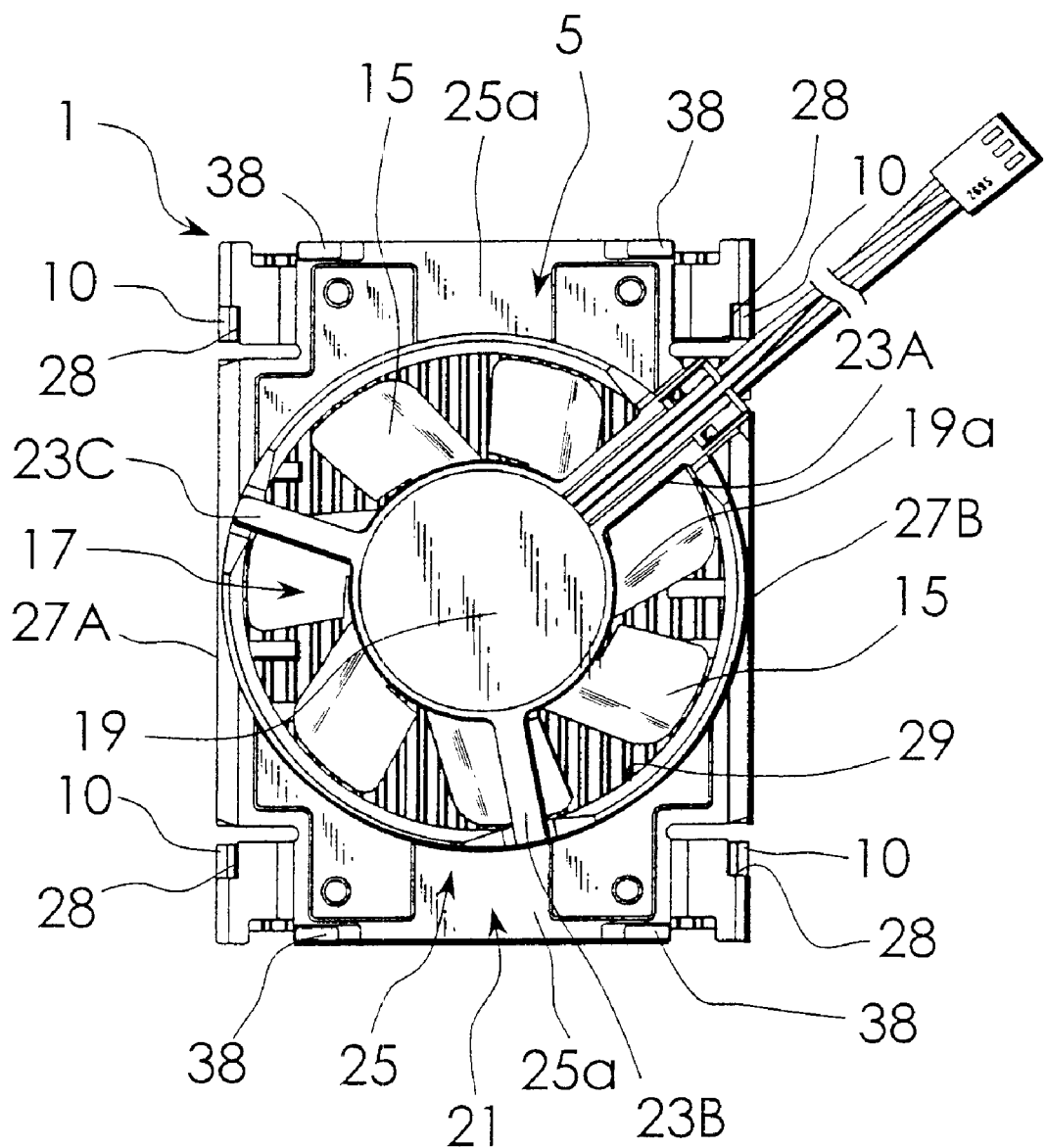
FIG. 1 is a top plan view showing an electronic component cooling apparatus according to an embodiment of the present invention.
Figure 2:
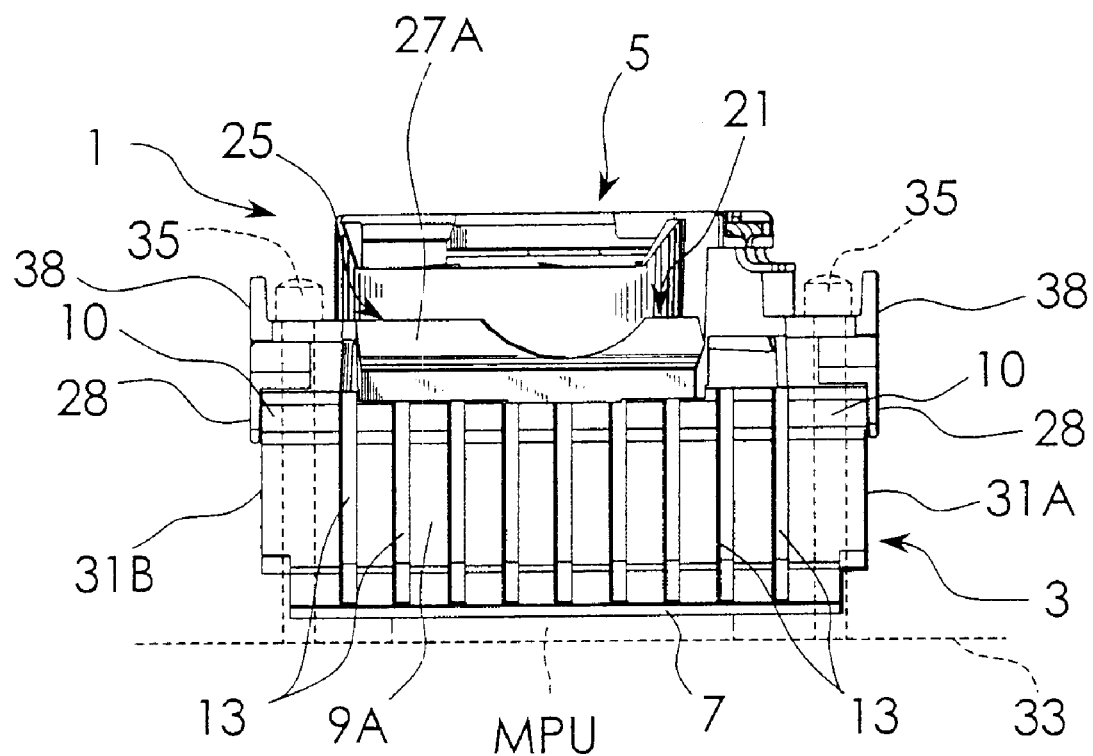
FIG. 2 is a front elevation view showing the electronic component cooling apparatus illustrated in FIG. 1.
Figure 3:
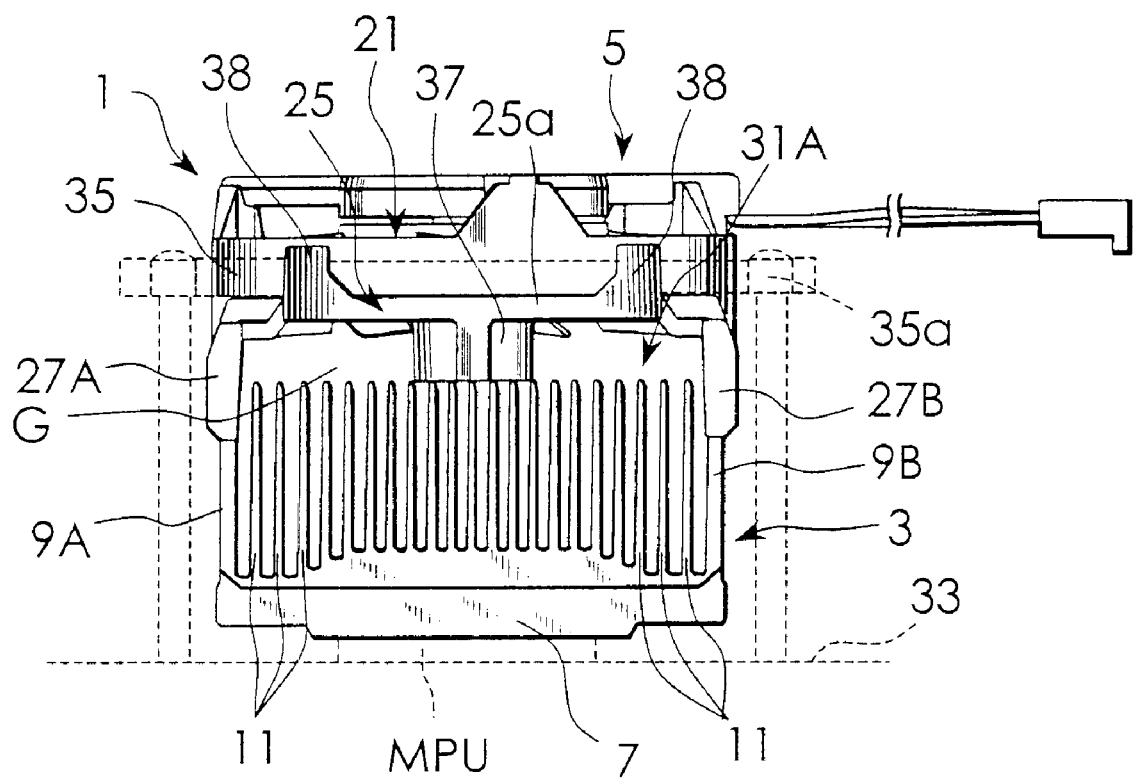
FIG. 3 is a left side elevation view showing the electronic component cooling apparatus illustrated in FIG. 1.
Figure 4:
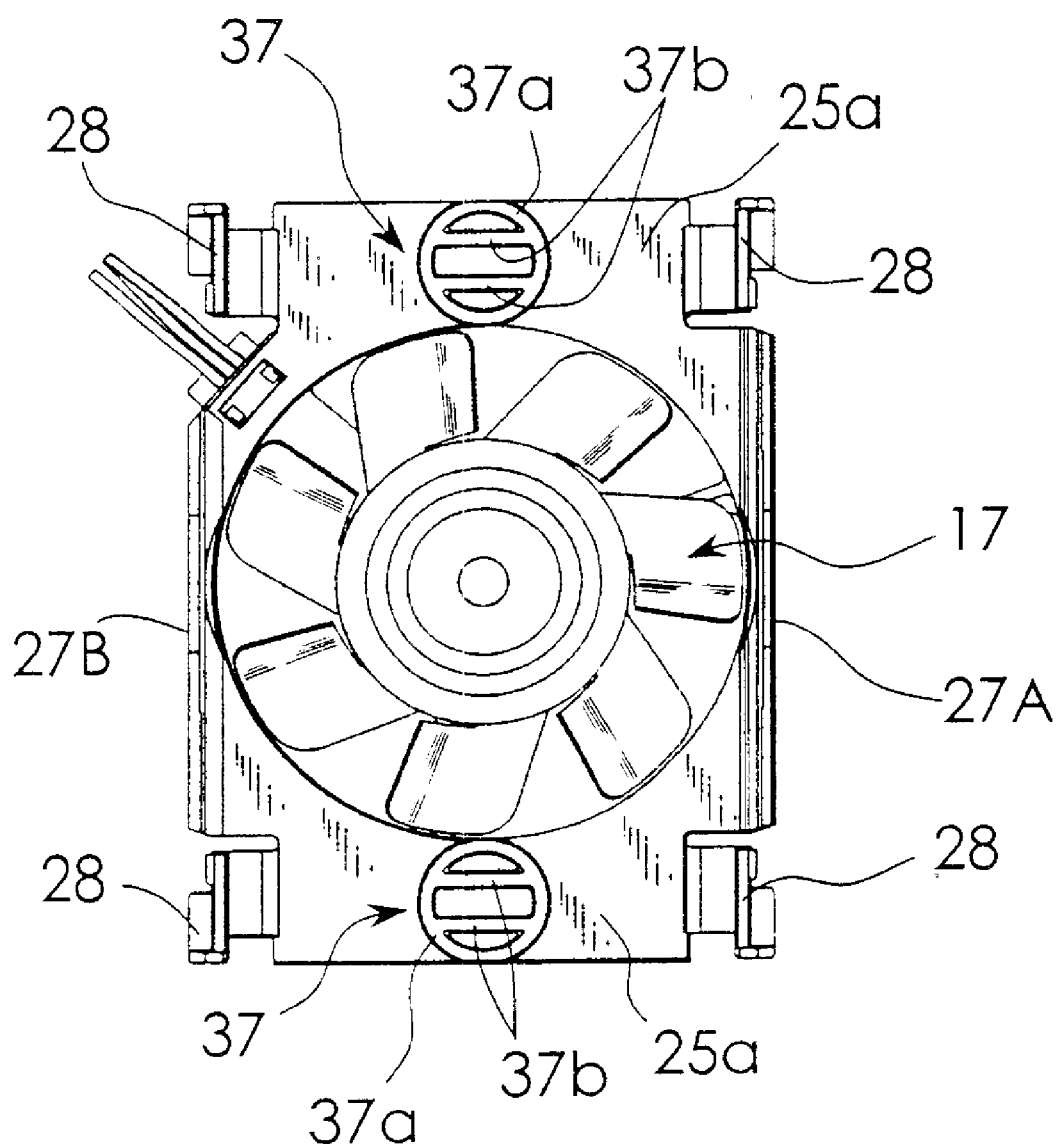
FIG. 4 is a back view showing a fan unit according to the embodiment illustrated in FIG. 1.

Now, an electronic component cooling apparatus according to the present invention will be described with reference to the accompanying drawings. Referring to FIGS. 1 to 4, an embodiment of the electronic component cooling apparatus according to the present invention is illustrated. FIGS. 1 to 3 are a top plan view, a front elevation view, and a left side elevation view of the electronic component cooling apparatus according to the present invention, respectively. FIG. 4 is a bottom plan view of a fan unit employed in this embodiment. As shown in the drawings, an electronic component cooling apparatus 1 according to this embodiment comprises a heat sink 3 integrally made of aluminum by extrusion molding and cutting and an axial fan unit 5.

The heat sink 3 comprises a rectangular base 7, and a pair of heat sink side walls 9A and 9B integrally arranged on both sides of the base defined in a direction perpendicular to a longitudinal (width) direction of the base 7 so as to extend toward the casing of the axial fan unit 5. An MPU, which is an electronic component to be cooled, may be mounted on/at the rear surface of the base through a holder, or may be mounted on the base directly using an adhesive. As shown in FIG. 3, a plurality of radiation fins 11 is integrally provided on the surface of the base 7 in the heat sink 3. These radiation fins 11 are disposed at given intervals to be substantially parallel to each other in the width direction of the base 7 perpendicular to the longitudinal direction of the base 7. This is the direction perpendicular to the longitudinal direction of the base 7 and that extends in parallel to the surface of the base 7, or the direction in which a pair of the heat sink side walls 9A and 9B are arranged or oppositely disposed. The radiation fins 11 each extend in the longitudinal direction of the base, while keeping a height thereof substantially unvaried. As seen from FIG. 3, the radiation fins 11 each have such a shape that its width gradually tapers as it becomes distant from the base 7.

As shown in FIG. 2, in the heat sink 3, a plurality of parting slits 13 are formed at predetermined intervals to extend in the longitudinal direction of the heat sink 3. The parting slits 13 extend continuously from the outsides of a pair of the heat sink side walls 9A and 9B toward the inside of the heat sink 3, for interrupting continuity of a part of the base 7 and the radiation fins 11 adjacent to the heat sink side walls 9A and 9B. The parting slits 13 are formed by preforming the heat sink with no parting slits 13 by extrusion molding and then subjecting the outside of a pair of the heat sink side walls 9A and 9B thus preformed to cutting by an NC machine tool. The parting slits 13 are formed into a length which prevents the parting slits 13 from interrupting continuity of a portion or region inside a portion or region opposite to blades 15 of an impeller 17 in the heat sink 3. Accordingly, the radiation fins 11 provided at the central portion of the base 7 extend continuously in the longitudinal direction of the base 7 without being interrupted by the parting slits 13.

As shown in FIG. 1, the axial fan unit 5 comprises the impeller 17 that includes seven blades 15, a motor 19 having a revolving shaft (not shown) fixedly mounted thereon with the impeller 17, for rotating the impeller 17, a casing 21, and three webs 23A to 23C. In this embodiment, the casing 21, a housing 19a of the motor 19, and the three webs 23A to 23C are integrally formed of a material that mainly consists of a synthetic resin material by molding. Since the structure inside the motor 19 is described in detail in Japanese Patent Application Laid-Open Publication No. 83873/1998, its description will be omitted.

The casing 21 comprises an opposite wall 25 arranged opposite to the leading ends of the radiation fins 11 with a gap, a pair of casing side walls 27A and 27B that extend from opposed edges of the opposite wall 25 toward the heat sink 3, and an opening 29. The opening 29 is formed to be circular, piercing the central portion of the opposite wall 25. The impeller 17 and the motor 19 are disposed inside the opening 29. The housing 19a and the casing 21 are coupled to three webs 23A to 23C so that the motor 19 is positioned in the center of the opening 29.

The axial fan unit 5 is so constructed that air is discharged in one axial direction of the revolving shaft of the motor 19 or toward the heat sink 3. A pair of the casing side walls 27A and 27B are disposed so as to extend in parallel with the radiation fins 11. Then, engaging sections 28 to be engaged with engaged sections 10 formed in the heat sink side walls 9A and 9B are provided at both ends of the casing side walls 27A and 27B, respectively and these engaging sections 28 and the engaged sections 10 comprise casing mounting means for mounting the casing 21 on the heat sink 3. The cross sections of the engaging sections 28 in the casing side walls 27A and 27B are formed to be shaped like hooks, and the cross sections of the engaging sections 10 in the heat sink side walls 9A and 9B are formed to be convex, thereby allowing engagement with the hook-like engaging sections. The engaging sections 28 are arranged to be located inside the engaged sections 10, thereby being engaged with the engaged sections 10. Then, by pushing the casing side walls 27A and 27B by fingers so that they approach to each other, engagement of the engaging sections 28 with the engaged sections 10 is released.

As described before, since a pair of the casing side walls 27A and 28B extend to be parallel to the radiation fins 11, when the casing 21 is combined with the heat sink 3, a pair of the openings 31A and 31B are formed at both sides of the radiation fins 11 defined in the longitudinal direction of the radiation fins 11 and at both sides of the opposite wall 25 where a pair of the casing side walls 27A and 27B are not located. With this arrangement, air discharged from the impeller 17 mainly flows in two opposing directions through a gap G between the leading ends of the radiation fins 11 and the opposite wall 25 and through intervals between the radiation fins 11 of the heat sink 3, for discharge from the casing 21 and the heat sink 3 through a pair of the openings 31A and 31B. If the gap G is formed between the leading ends of the radiation fins 11 and the opposite wall 25 as in this embodiment, the air discharged from the impeller 17 passes through the gap G and passes through all the intervals between the radiation fins 11. The cooling effect of the electronic component MPU can be thereby enhanced.

The opposite wall 25 has substantially a rectangular board shape and includes in two directions described before where the openings 31A and 31B are located, a pair of wall sections 25a with the opening 29 interposed therebetween. As shown in FIGS. 3 and 4, a pair of pushing force transferring sections 37 are integrally provided on the rear side of a pair of the wall sections 25a. The cross sections of a pair of the pushing force transferring sections 37 are substantially circular, and the pushing force transferring sections protrude toward the base 7 of the heat sink 3 from a pair of the wall sections 25a. A pair of the pushing force transferring sections 37 are formed at the central portions of a pair of the wall sections 25a with the opening 29 interposed therebetween so as to be symmetrical to each other with respect to the opening 29. As shown in FIG. 4, each of the pushing force transferring sections 37 comprises a cylindrical section 37a and two reinforcing ribs 37b. The reinforcing ribs 37b are coupled to the cylindrical section 37a and are formed to be parallel to each other within the cylindrical section 37a, thereby reinforcing the cylindrical section 37a. This structure is adopted so as to prevent deformation of the opposite wall 25 when the casing 21 is molded in one piece using a synthetic resin. With this structure, it is so arranged that an extremely thick portion be not formed in the opposite wall 25. Preferably, the cross sectional shape of a pair of the pushing force transferring sections 37 is defined so as to reduce air resistance against air that flows through the gap G. In this embodiment, the outside shape of a pair of the pushing force transferring sections 37 is so defined that the shape of their cross sections becomes substantially circular. This arrangement can prevent the airflow from being severely blocked with the pushing force transferring sections 37. If the cross sectional shape of the pushing force transferring sections 37 is formed to be substantially circular as in this embodiment in particular, air resistance can be reduced, and the mechanical strength of the pushing force transferring sections 37 can be increased. Accordingly, as will be described below, when a pushing force is applied to a pair of the wall sections 25a, a pair of the pushing force transferring sections 37 will not be destructed by the force, so that transfer of the applied pushing force to the heat sink 3 can be ensured. The size or diameter of a pair of the pushing force transferring sections 37 should be defined so that the airflow within the gap G is not extremely obstructed or the cooling efficiency of the heat sink is not greatly reduced, and the force applied to the electronic component MPU is distributed evenly through the base 7 of the heat sink 3, thereby ensuring satisfactorily intimate contact between the base 7 and the electronic component.

On the surfaces of a pair of the wall sections 25a, four upright members 38 are integrally provided in the direction away from the heat sink 3 or in the direction perpendicular to the surfaces of the wall sections 25a. These upright members 38 constitute an engaging section for preventing mounting tools 35 (to be described below) from coming off.

The mounting tools 35 indicated by dotted lines in FIGS. 2 and 3 are so constructed that, when mounting the electronic component cooling apparatus 1 on a circuit board 33, they apply a pushing force to a pair of the wall sections 25a, thereby pushing the wall sections 25a against the heat sink 3. The structure of the mounting tools 35 differs depending on the design of the mounting tool manufacturer, and it is not limited to the illustrated shape. A horizontal bar 35a for the mounting tools 35 applies to a pair of the wall sections 25a the pushing force that pushes a pair of the wall sections 25a against the heat sink 3 or pushes the base 7 of the heat sink 3 against the electronic component MPU. This pushing force is transferred to the base 7 of the heat sink 3 through the casing side walls 27A and 27B and the heat sink side walls 9A and 9B coupled by the casing mounting means, a pair of the pushing force transferring sections 37, and the radiation fins 11.

In this embodiment, as shown in FIG. 3, when the mounting tools 35 apply a pushing force to a pair of the wall sections 25a of the opposite wall so as to push the wall sections 25a against the heat sink 3, the applied pushing force is transferred to the heat sink 3 through the pushing force transferring sections 37 as well as through the casing side walls 27A and 27B and the heat sink side walls 9A and 9B. Then, the pushing force is applied to the electronic component MPU through the heat sink 3. For this reason, the pushing force is distributed for transfer to the heat sink 3, so that the force applied to the electronic component MPU will not become locally and extremely large, or will not be brought into the unbalanced state. In other words, the pushing force is substantially evenly applied to the entire surface of the electronic component MPU. Consequently, the electronic component MPU is brought into well-balanced contact with the base 7 of the heat sink 3, thereby enabling prevention of local unbalance in heat dissipation of the electronic component MPU.

Figure 5:
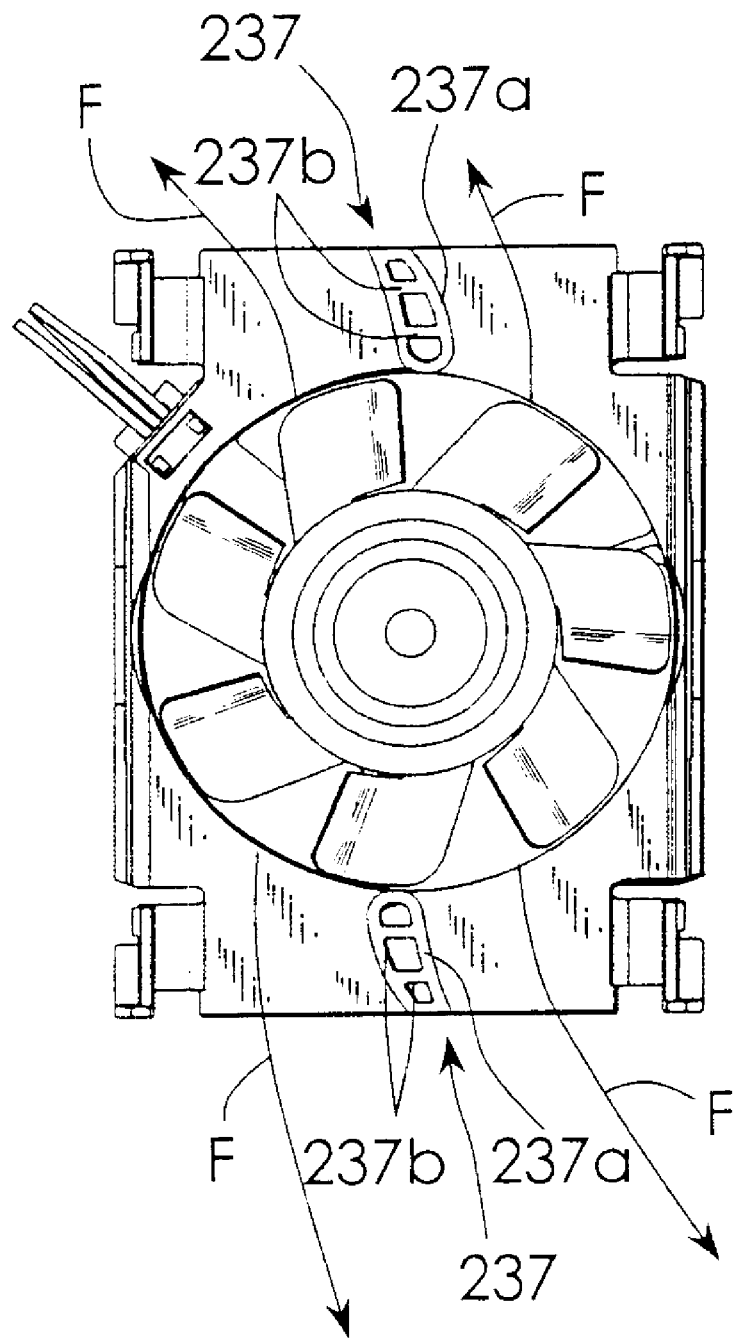
FIG. 5 is a back view showing a fan unit of an electronic component cooling apparatus according to other embodiment of the present invention.
Figure 6:
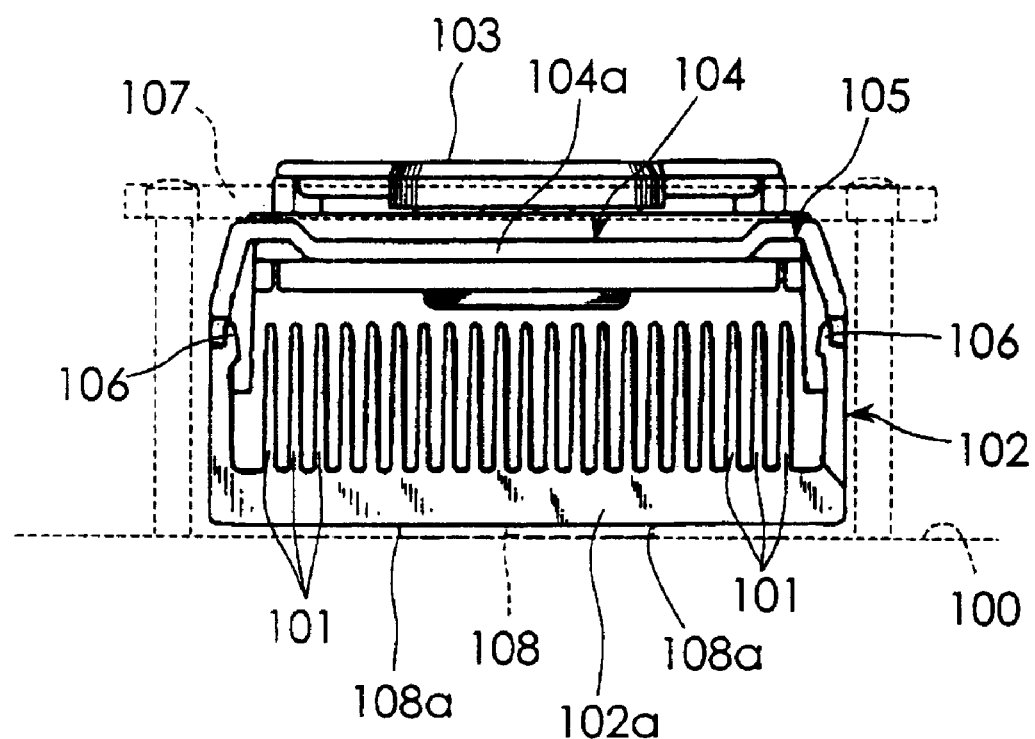
FIG. 6 is a side elevation view of a conventional electronic component cooling apparatus.

FIG. 5 is a back view showing a fan unit used in other embodiment of an electronic component cooling apparatus according to the present invention. The electronic cooling apparatus according to the present invention has the same structure as that of the electronic component cooling apparatus illustrated in FIG. 4, except for the shape of the members for applying a pushing force. Pushing force transferring sections 237 of the electronic component cooling apparatus in this embodiment have an elongate, streamlined shape so that they parallel airflows indicated by arrows F, which are discharged from the axial fan unit 5 and then flow through the gap G between the leading ends of the radiation fins 11 and the opposite wall 25. Each of the pushing force transferring sections 237 comprises a cylindrical section 237a and two reinforcing ribs 237b. By using the pushing force transferring sections 237 according to this embodiment, air resistance against airflow can be considerably reduced.

In the embodiments described above, each of a pair of the wall sections of the opposite wall is provided with one pushing force transferring section. The pushing force transferring section may be so constructed that it distributes and transfers a pushing force to the heat sink so that it does not greatly obstruct airflow and does not extremely and locally increase a force applied to the electronic component. The number, shape, and dimensions of the pushing force transferring section can be arbitrarily set. A plurality of elongate ribs, for example, can also form the pushing force transferring section.

Though the heat sink is formed by extrusion molding in the embodiments described above, it may of course be formed by other molding methods such as casting.

In accordance with the above-mentioned embodiments, the pushing force transferring section distributes a pushing force for transfer to the heat sink, so that the force applied to an electronic component will not increase locally and extremely. For this reason, good contact can be established between the electronic component and the base of the heat sink. Thus, in accordance with the above-mentioned embodiments, local unbalance in heat dissipation of the electronic component will not occur. A reduction in the heat dissipation effect can be thereby prevented.

What is claimed is:

1. An electronic component cooling apparatus comprising:
   a heat sink having a base having a front surface provided thereon with a plurality of radiation fins and a rear surface to be mounted thereon with an electronic component to be cooled;
   a fan unit including an impeller having a plurality of blades, a motor for rotating said impeller mounted on a rotor fixedly mounted on a revolving shaft, and a casing having an opposite wall arranged opposite to leading ends of said radiation fins in said heat sink and an opening for receiving said impeller; and
   casing mounting means for mounting said casing on said heat sink so that said leading ends of said radiation fins are spaced from said opposite wall to define a gap;
   wherein air discharged from said impeller passes through said gap and intervals between said radiation fins of said heat sink and is discharged to an outside of said casing and said heat sink;
   wherein said base of said heat sink is pushed against said electronic component with said pushing force toward said heat sink being applied to a pair of wall sections of said opposite wall located with said opening of said casing interposed therebetween;
   wherein at least one pushing force transferring section for transferring said pushing force to said heat sink through contact with said leading ends of said radiation fins is integrally provided at each of said pair of wall sections of said opposite wall, and
   wherein said at least one pushing force transferring section at each of said pair of wall sections is constructed to distribute said pushing force and transfer distributed force to said heat sink so as to prevent a force applied to said electronic component by said pushing force from increasing locally and extremely.

2. The electronic component cooling apparatus as defined in claim 1, wherein a cross sectional profile of said at least one pushing force transferring section is defined so as to reduce air resistance against the air that passes through said gap.

3. The electronic component cooling apparatus as defined in claim 2, wherein said cross sectional profile is substantially circular.

4. The electronic cooling apparatus as defined in claim 3, wherein said fan unit is an axial fan unit for discharging air in one of axial directions of said revolving shaft of said motor, and
   wherein said cross sectional profile of said pushing force transferring section is an elongate, streamlined shape so as not to make a large resistance against a flow of said air discharged from said axial fan unit for passage through said gap.

5. The electronic component cooling apparatus as defined in claim 1, wherein said one pushing force transferring section is provided at each of said pair of wall sections, and wherein said pushing force transferring sections at said pair of wall sections are disposed symmetrically on opposite sides of said opening.

6. The electronic component cooling apparatus according to claim 1, wherein said at least one pushing force transferring section is provided at a central portion of each of said pair of wall sections of said opposite wall.

7. An electronic component cooling apparatus comprising:

a heat sink having a base having a front surface provided thereon with a plurality of radiation fins and a rear surface to be mounted thereon with an electronic component to be cooled;

a fan unit including an impeller having a plurality of blades, a motor for rotating said impeller mounted on a rotor fixedly mounted on a revolving shaft, and a casing having an opposite wall arranged opposite to leading ends of said radiation fins in said heat sink and an opening for receiving said impeller; and casing mounting means for mounting said casing on said heat sink so that said leading ends of said radiation fins are spaced from said opposite wall to define a gap;

wherein said casing and said heat sink is constructed to form a pair of openings through which air discharged from said impeller passes through said gap and intervals between said radiation fins of said heat sink and then flows in two opposite directions for discharge to an outside of said casing and said heat sink;

wherein said base of said heat sink is pushed against said electronic component with a pushing force toward said heat sink being applied to a pair of wall sections of said opposite wall located in said two directions with said opening of said casing interposed therebetween;

wherein at least one pushing force transferring section for transferring said pushing force to said heat sink by being brought into contact with said leading ends of said radiation fins is integrally provided at each of said pair of wall sections of said opposite wall, and wherein said at least one pushing force transferring section at each of said pair of wall sections is constructed to distribute said pushing force and transfer distributed force to said heat sink so as to prevent a force applied to said electronic component by said pushing force from increasing locally and extremely.

8. The electronic component cooling apparatus as defined in claim 7, wherein a cross sectional profile of said at least one pushing force transferring section is defined so as to reduce air resistance against the air that passes through said gap.

9. The electronic component cooling apparatus as defined in claim 8, wherein said cross sectional profile is substantially circular.

10. The electronic cooling apparatus as defined in claim 9, wherein said fan unit is an axial fan unit for discharging air in one of axial directions of said revolving shaft of said motor, and wherein said cross sectional profile of said pushing force transferring section is an elongate, streamlined shape so as not to make a large resistance against a flow of said air discharged from said axial fan unit for passage through said gap.

11. The electronic component cooling apparatus as defined in claim 7, wherein said one pushing force transferring section is provided at each of said pair of wall sections, and wherein said pushing force transferring sections at said pair of wall sections are disposed symmetrically on opposite sides of said opening.

12. An electronic component cooling apparatus comprising:

a heat sink having a base having a front surface provided thereon with a plurality of radiation fins and a rear surface to be mounted thereon with an electronic component to be cooled, and a pair of heat sink side walls being upright from a pair of opposite ends of said base with said radiation fins interposed therebetween;

an axial fan unit including an impeller having a plurality of blades, a motor for rotating said impeller mounted on a rotor fixedly mounted on a revolving shaft, a casing having an opposite wall arranged opposite to leading ends of said radiation fins in said heat sink with a gap, a pair of casing side walls extending to said heat sink from opposite edges of said opposite wall, and an opening for receiving said impeller and said motor, and a plurality of webs coupling a housing of said motor to said casing so that said motor is positioned at a central portion of said opening; and casing mounting means for mounting said casing on said heat sink by engagement of engaging sections each provided on said pair of casing side walls with engaged sections each provided on said pair of heat sink side walls;

wherein said casing and said heat sink is constructed to form a pair of openings through which air discharged from said impeller passes through said gap and intervals between said radiation fins in said heat sink and then flows in two opposite directions for discharge to an outside of said casing and said heat sink;

wherein said base of said heat sink is pushed against said electronic component with said pushing force toward said heat sink being applied to a pair of wall sections of said opposite wall located in said two directions with said opening of said casing interposed therebetween;

wherein pushing force transferring sections for transferring said pushing force to said heat sink through contact with said leading ends of said radiation fins are each integrally formed at each of said pair of wall sections of said opposite wall, and wherein said pushing force transferring sections are constructed to distribute said pushing force and transfer distributed force to said heat sink so that a force applied to said electronic component through said casing mounting means, said pushing force transferring sections, and said heat sink by said pushing force is not in an unbalanced state that causes extreme unbalance in contact between said electronic component and said base of said heat sink.

\* \* \* \* \*